(12) United States Patent
Takahashi

(10) Patent No.: US 7,407,358 B2
(45) Date of Patent: Aug. 5, 2008

(54) INTERBACK-TYPE SUBSTRATE PROCESSING DEVICE

(75) Inventor: Nobuyuki Takahashi, Kanagawa-ken (JP)

(73) Assignee: Minolta Co., Ltd., Osaka-Shi, Osaka (JP)

( * ) Notice: Subject to any disclaimer, the term of this patent is extended or adjusted under 35 U.S.C. 154(b) by 475 days.

(21) Appl. No.: 10/015,601

(22) Filed: Dec. 17, 2001

(65) Prior Publication Data

US 2002/0080291 A1 Jun. 27, 2002

(30) Foreign Application Priority Data

Dec. 27, 2000 (JP) ............................. 2000-399444

(51) Int. Cl.
*H01L 21/677* (2006.01)

(52) U.S. Cl. .................................. 414/217; 204/298.15

(58) Field of Classification Search .............. 198/346.2; 204/298, 192.12, 298.15; 414/217, 331.03, 414/331.07, 939, 769, 770
See application file for complete search history.

(56) References Cited

U.S. PATENT DOCUMENTS

| 4,405,435 | A | | 9/1983 | Tateishi et al. |
|---|---|---|---|---|
| 4,500,407 | A | * | 2/1985 | Boys et al. ............. 204/298.25 |
| 4,643,629 | A | * | 2/1987 | Takahashi et al. ...... 414/331.17 |
| 4,651,674 | A | | 3/1987 | Hayashi et al. |
| 4,813,846 | A | | 3/1989 | Helms |
| 4,981,408 | A | * | 1/1991 | Hughes et al. ............... 414/217 |
| 4,993,559 | A | | 2/1991 | Cota |
| 5,288,329 | A | * | 2/1994 | Nakamura et al. .......... 118/729 |
| 5,376,212 | A | * | 12/1994 | Saiki ...................... 156/345.31 |
| 5,379,984 | A | | 1/1995 | Coad et al. |
| 5,417,537 | A | * | 5/1995 | Miller ........................ 414/217 |
| 5,738,767 | A | | 4/1998 | Coad et al. |
| 6,027,618 | A | * | 2/2000 | Aruga et al. ........... 204/192.12 |
| 6,083,566 | A | | 7/2000 | Whitesell |
| 6,205,870 | B1 | | 3/2001 | Hosokawa et al. |
| 6,228,439 | B1 | | 5/2001 | Watanabe et al. |
| 6,251,191 | B1 | | 6/2001 | Matsuse |
| 6,309,525 | B2 | | 10/2001 | Futagawa et al. |

(Continued)

FOREIGN PATENT DOCUMENTS

JP 06-69316 3/1994

(Continued)

OTHER PUBLICATIONS

U.S. Appl. No. 09/927,932, filed Aug. 13, 2001, Nobuyuki Takahashi—"Substrate Processing Apparatus".

*Primary Examiner*—Charles A. Fox

(57) ABSTRACT

An interback-type device in which a substrate 9 is carried into the device from one side of the device and is inverted in the device to be carried out and returned to the same side, a plurality of vacuum processing chambers 21, 22, 23 are longitudinally-provided and hermetically connected, and a carry system which passes through these vacuum chambers for carrying the substrate along established carry lines 94, 95L, 95R is provided. The carry line includes an outward carry line 94 toward an inversion position and return carry lines 95L, 95R returning from the inversion position, and the outward line 94 and return carry lines 94, 95L, 95R are different parallel paths, and the return carry lines 95L, 95R are branched in plurality. The outward carry line 94 and return carry lines 95L, 95R are established to pass through the same three processing chambers 21, 22, 23.

17 Claims, 10 Drawing Sheets

U.S. PATENT DOCUMENTS

| | | | |
|---|---|---|---|
| 6,315,879 B1 | 11/2001 | Washburn et al. | |
| 6,336,546 B1 * | 1/2002 | Lorenz | 198/346.2 |
| 6,358,377 B1 * | 3/2002 | Schloremberg et al. | 204/192.12 |
| 6,451,181 B1 | 9/2002 | Denning et al. | |
| 2002/0078892 A1 | 6/2002 | Takahashi | |
| 2002/0080291 A1 | 6/2002 | Takahashi | |

FOREIGN PATENT DOCUMENTS

| | | |
|---|---|---|
| JP | 09-129569 A | 5/1997 |
| JP | 2000-177842 | 6/2000 |

\* cited by examiner

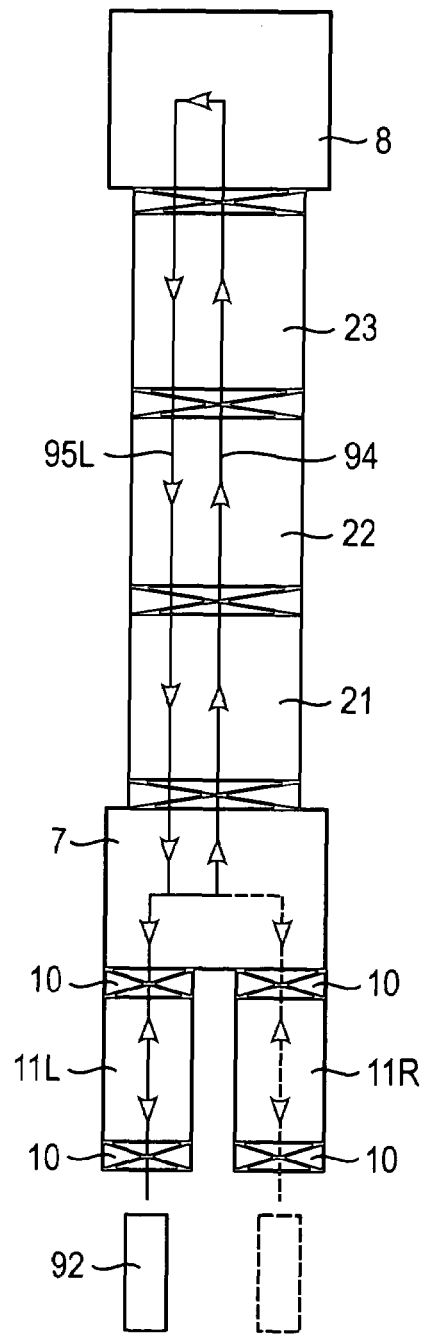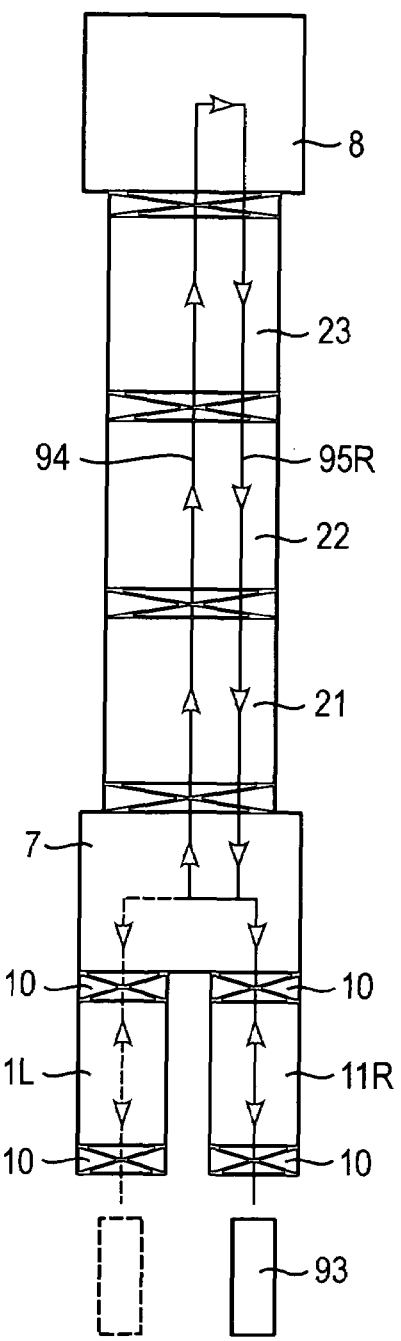

INTERBACK-TYPE SUBSTRATE PROCESSING DEVICE

CROSS-REFERENCE TO RELATED APPLICATIONS

The present application claims the priority of JP2000-399444, filed in Japan on Dec. 27, 2000, the entire contents of which are hereby incorporated by reference.

BACKGROUND OF THE APPLICATION

1. Technological Field to Which the Invention Belongs

The invention of the present application relates to a substrate processing device suitable for use in the manufacture of display devices, such as liquid crystal displays.

2. Discussion of Related Art

In the manufacture of various display devices, such as liquid crystal displays and plasma displays, a process such as surface-processing must be administered on a plate-shaped material that forms the base of the device (hereinbelow referred to as the substrate). By way of example, in liquid crystal displays, a process to form a transparent electrode on the plate surface (surface that is not the peripheral surface) of the glass substrate is required.

The substrate processing device employed in processing of this kind comprises a chamber configured in such a way that it can be pumped out to a vacuum or a predetermined gas can be introduced to the inner space because the processing of the substrate is performed in a predetermined atmosphere. As different processes are continuously performed therein and the pressure must be gradually lowered from atmospheric pressure, the configuration that is adopted comprises a plurality of chambers.

Substrate processing devices of the prior art such as this may, in terms of the layout of the chambers, be broadly classified into two types. One is known as the inline-type and the other is known as the cluster tool-type.

FIG. 9 shows the schematic configuration of an inline-type device as a typical substrate processing device of the prior art. The inline-type device uses a configuration in which a plurality of chambers 2, 3, 11 and 12 are longitudinally-provided in a straight line. A carry system, which carries the substrate 9, is provided so as to penetrate the plurality of chambers 2, 3, 11 and 12. In addition, gate valves 10 are provided between the chambers 2, 3, 11 and 12.

The substrate 9 is carried in sequence through the chambers by the carry system in a state in which it is mounted on a tray 91 for processing. One of the plurality of chambers is a load-lock chamber 11 which opens to the atmosphere when the substrate 9 is carried in, and another chamber is a load-lock chamber 12 which opens to the atmosphere when the substrate 9 is carried out. The remaining chambers include chambers for processing (hereinbelow, processing chambers) 2. In addition, a chamber 3, provided between the processing chamber 2 and the load-lock chamber 11 or unload-lock chamber 12, constitutes a pressure-adjustment chamber. As there is a large pressure difference between the load-lock chamber 11 (or unload-lock chamber 12) and the processing chamber 2, the pressure adjustment chamber 3 maintains and adjusts the atmosphere to an interim pressure therebetween.

As shown in FIG. 9, the configuration of the carry system enables the movement of the tray 91, on which the substrate 9 is mounted, by the use of carry rollers 41. These carry rollers 41 constitute a pair of small disk-shaped members provided at both ends of a rotating shaft extending perpendicular with the direction of carry in the horizontal direction. The carry system is configured by the provision of, in a predetermined interval in the direction of carry, a large number of groups of rotating shafts and pairs of carry rollers 41. As is clear from FIG. 9, the substrate 9 is carried and processed horizontally.

On the other hand, FIG. 10 shows, as another example of a typical substrate processing device of the prior art, a schematic configuration of a cluster tool-type device. The cluster tool-type device uses a configuration in which, in the perimeter of a carry chamber 5 in which a transfer robot 42 is provided in the inner part, load-lock chambers 11 and a plurality of processing chambers 2 are provided. In the example shown in FIG. 10, two load-lock chambers 11 are provided. In addition, gate valves 10 are provided between the carry chamber 5, load-lock chambers 11, and the processing chambers 2.

The transfer robot 42 takes out the substrate 9 from one load-lock chamber 11 and carries it in sequence to the processing chambers 2. The transfer robot 42, following processing, returns the substrate 9 to the other load-lock chamber 11. It will be noted that, although the load-lock chamber 11 shown in FIG. 10 performs the unlock load chamber 12 function in the device shown in FIG. 9, the name "load-lock chamber" is used without alteration.

The transfer robot 42 is an articulated type robot. The substrate 9 is mounted and carried on the tip-end of the arm thereof. To carry the substrate 9 to a predetermined position, the transfer robot 42 performs arm extension and contraction, rotation, and a range of vertical movements. The substrate 9 is mounted and carried on the arm horizontally. In addition, the substrate 9 is also supported and processed horizontally within the processing chamber 2.

In substrate processing devices of this kind, at the heart of the demands for greater intricacy of the entire process and improvements to the productivity is the need for a large number of both different and identical processing steps to be able to be continuously performed. That is to say, due to an increased intricacy of the entire process, different processing steps must be continuously performed, and in order for productivity to be improved, identical processing steps must be broken up and performed at the same time. It will be noted that the term "continuously" used here refers to the execution of a next processing step without the substrate having been taken out into the atmosphere.

Because of a need to increase the number of processing steps in this way, the substrate processing devices of the prior art described above have the following problems.

First, in inline-type substrate processing devices, when the number of processing chambers is increased in order to increase the number of processing steps, the length of the device in the direction of the tray line is lengthened by that amount. In inline-type devices, because the substrate is carried in from one side of the device and is carried out from the other side, problems of workability and efficiency arise when the length of the device is increased and the carry-in position and the collection position of the substrate are separated further. In addition, a problem arises in that it is difficult for devices that are lengthy to be assembled in existing production lines.

On the other hand, in cluster tool-type devices, if an attempt is made to increase the number of processing chambers, the sides of the center carry chamber must be enlarged. There are drawbacks accompanying this in that the cross-section of the carry chamber is larger and the occupied area of the device as a whole is larger. As the carry chamber is a section that does not directly contribute to productivity, an increase in size of this section is undesirable. In addition, when the carry chamber is enlarged, there are problems in that the scale of the pump system for pumping out the inner space is larger and more expensive. Furthermore, when the carry chamber is enlarged, the operation range required of the carry robot for carrying the substrate to the chambers increases. As a result, the scale of the transfer robot is larger and more expensive and, as a result of a lengthening of the arm of the transfer robot, problems in flexibility of the arm and reduction of carry precision arise.

OBJECTS AND SUMMARY

The technological significance of the invention of the present application, which is designed in order to solve these problems, lies in the fact that it provides a substrate processing device that is able to meet the demands of a greater intricacy of the process as a whole and improvements in productivity.

According to one aspect of the present invention, a substrate processing device in which a substrate is carried into the device from one side of the device and is inverted in the device to be carried out and returned to the same side is provided. The device comprises a plurality of vacuum processing chambers for administering a process on the substrate therein are longitudinally provided and hermetically connected to each other; and a substrate carry system which passes through the vacuum chambers. The substrate carry system includes an outward carry line that extends from a first position to an inversion position within the device, a return carry line from the inversion position to a second position; and at least one of a second outward carry line that extends from the first position to the inversion position within the device and a second return carry line from the inversion position to the second position, wherein each of the carry lines has a different path.

According to another aspect of the invention, a substrate processing device in which a substrate is carried into the device from one side of the device and is inverted in the device to be carried out and returned to the same side is provided. The device comprises a load lock chamber for loading and unloading the substrate at the same side of the device; a plurality of vacuum processing chambers for administering a process on the substrate therein are longitudinally provided and hermetically connected to each other; an intermediate chamber arranged between the load lock chamber and the plurality of vacuum processing chambers; and a substrate carry system which passes through the intermediate chamber and the plurality of vacuum chambers. The substrate carry system includes an outward carry line that extends from a first position to an inversion position within the device, a return carry line from the inversion position to a second position; an intermediate line extending from the intermediate chamber to the load lock chamber; a branch line in the intermediate chamber along which the substrate can be moved from the intermediate line to or from the outward carry line and the return carry line; and at least one of a second outward carry line that extends from the first position to the inversion position within the device and a second return carry line from the inversion position to the second position, wherein each of the carry lines has a different path.

According to another aspect of the present invention, the aforementioned device further includes an inversion chamber arranged at an end of the device opposite the load lock chamber and an inversion line in the inversion chamber along which the substrate can be moved from the inversion line to or from the outward carry line and the return carry line.

BRIEF DESCRIPTION OF THE DIAGRAMS

Figure 1:
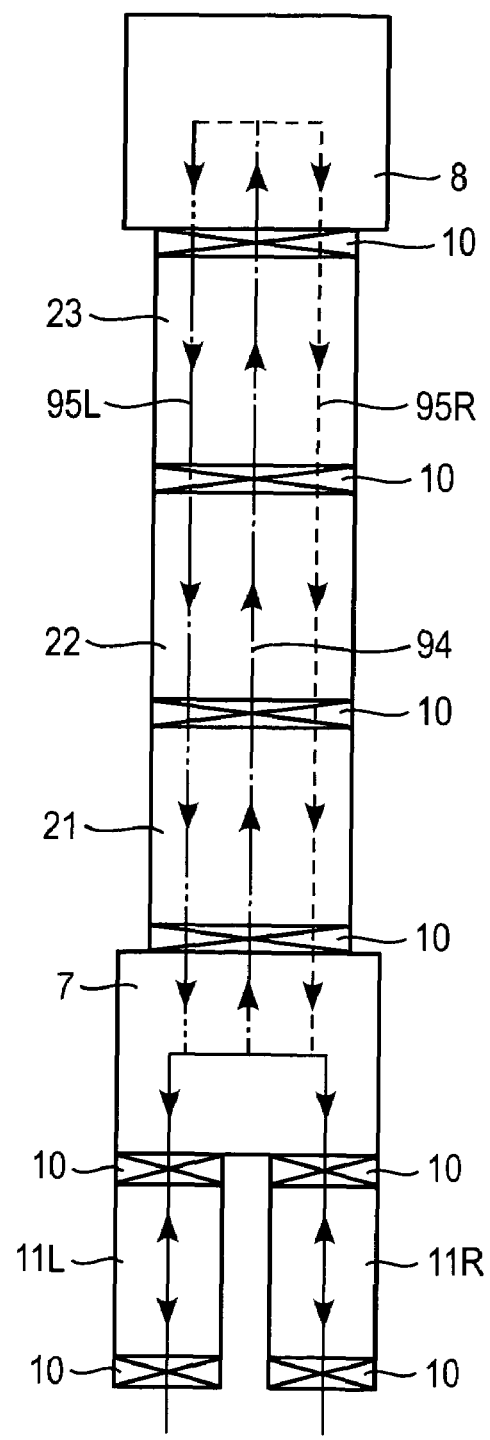
FIG. 1 is a plane schematic view of an embodiment of a substrate processing device of the present invention.

FIGS. 6(1) and 6(2) are a diagram for explaining movement of the substrate holders 92, 93 along the carry lines 94, 95L, 95R shown in FIG. 1.

Figure 7:
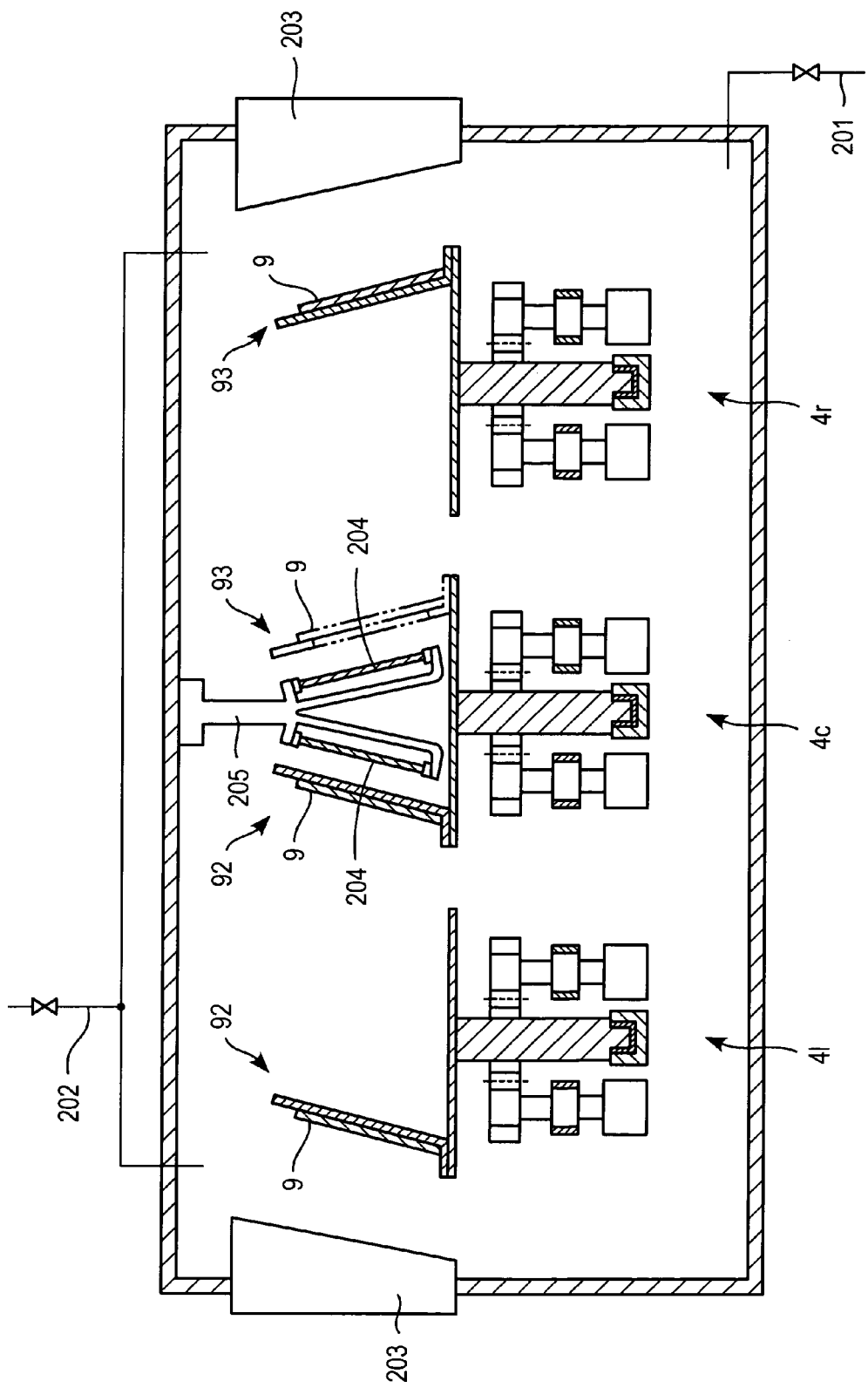

FIG. 7 is a cross-sectional schematic view of the processing chamber 21 shown in FIG. 1.

Figure 8:
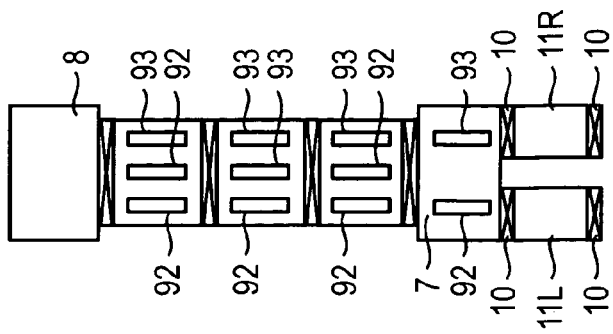
Figure 8:
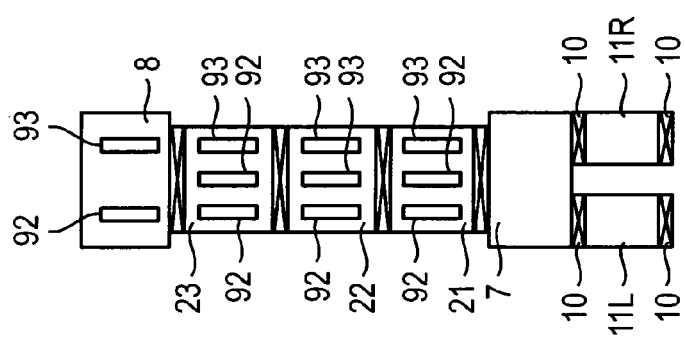
Figure 8:
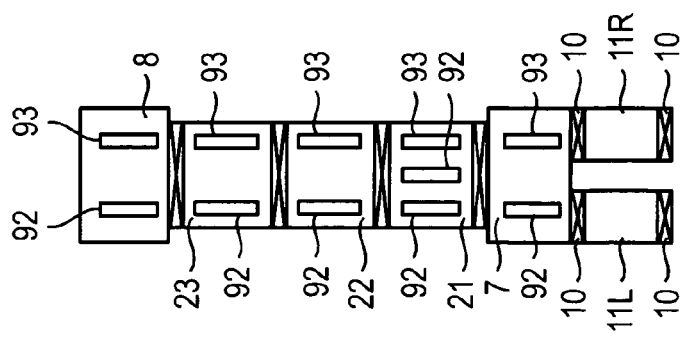
Figure 8:
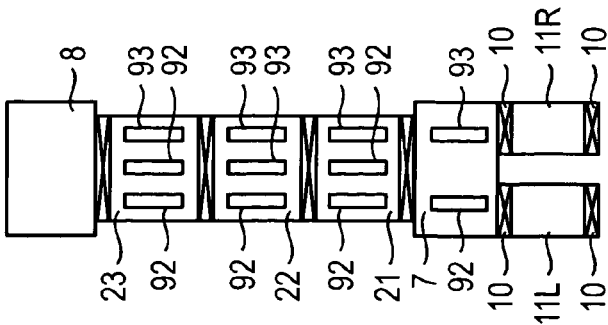

FIGS. 8(1), 8(2), 8(3) and 8(4) are a diagram for explaining the action of a device of an embodiment of the present invention.

Figure 9:
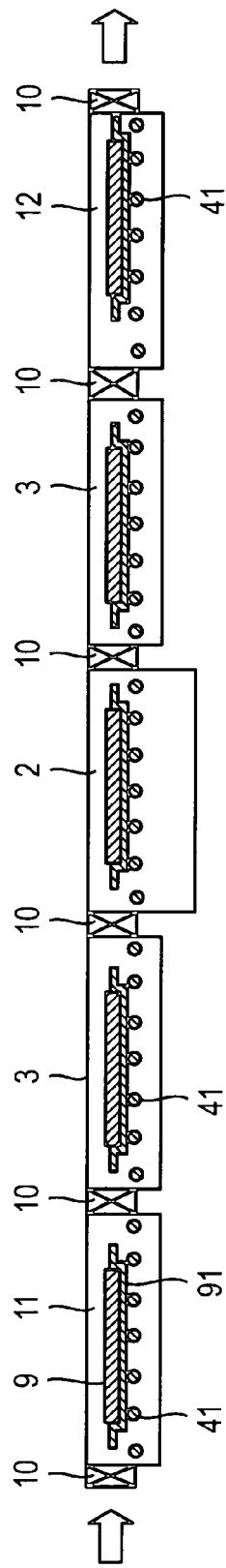

FIG. 9 shows a schematic configuration of an inline device as one example of a typical substrate processing device of the prior art.

Figure 10:
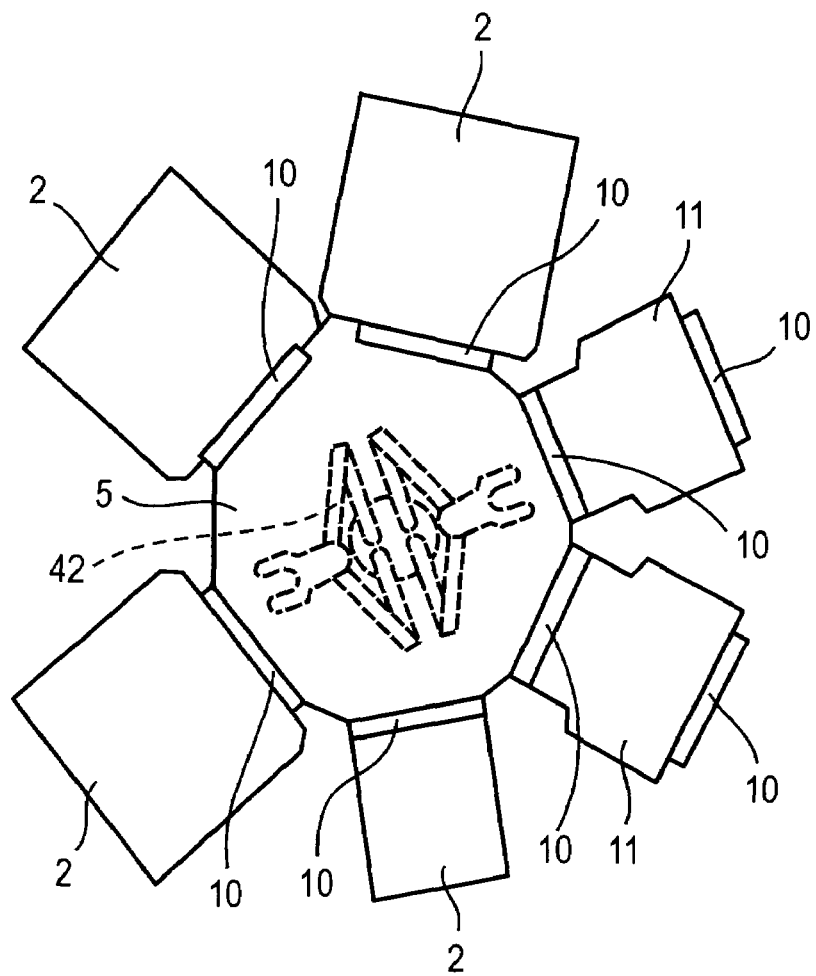

FIG. 10 shows a schematic configuration of the cluster tool-type device as one example of a typical substrate processing device of the prior art.

DETAILED DESCRIPTION OF THE PREFERRED EMBODIMENTS

With reference to FIG. 1, a description is given of the entire configuration of a preferred embodiment of a substrate processing device of the present invention. FIG. 1 is a plane-surface schematic view of the preferred embodiment.

The substrate processing device shown in FIG. 1 is a structure in which a plurality of vacuum chambers comprising processing chambers 21, 22, 23 for administering predetermined processing to a substrate 9 therein are hermetically connected. In addition, the device comprises a carry system (not shown in the diagram) for transferring the substrate 9 in sequence to the plurality of vacuum chambers.

Two of the plurality of vacuum chambers form load-lock chambers 11L, 11R with the atmospheric side in which, at times when the substrate 9 is introduced and discharged, the substrate 9 is temporarily retained. The two load-lock chambers 11L, 11R are arranged on the same side of the system as shown in FIG. 1. Accordingly, the transfer-in and transfer-out of the substrate is performed on the same side of the system.

The two load-lock chambers 11L, 11R are provided in lateral alignment. An intermediate chamber 7, provided in alignment with the three longitudinally-provided processing chambers 21, 22, 23, is provided between the two load-lock chambers 11L, 11R. In addition, an inversion chamber 8 is connected to the processing chamber 23 on the furthermost side from the intermediate chamber 7. The intermediate chamber 7 and inversion chamber 8 are hermetic vacuum chambers.

These chambers 11L, 11R, 21, 22, 23, 7 and 8 are provided with a pumping system not shown in FIG. 1. The pumping system is configured from a turbo-molecular pump or chyogenic pump and is capable of pumping out to a pressure of the order of $10^{-3}$ to $10^{-5}$ Pa. These chambers 11L, 11R, 21, 22, 23, 7 and 8 are hermetically connected by way of gate valves 10. A load station not shown in the diagram, which constitutes the position for the mounting of the unprocessed substrate 9 on the substrate holder and collection of the substrate 9 that has been processed from the substrate holder is provided at the outer side of the load-lock chambers 11L, 11R.

Figure 2:
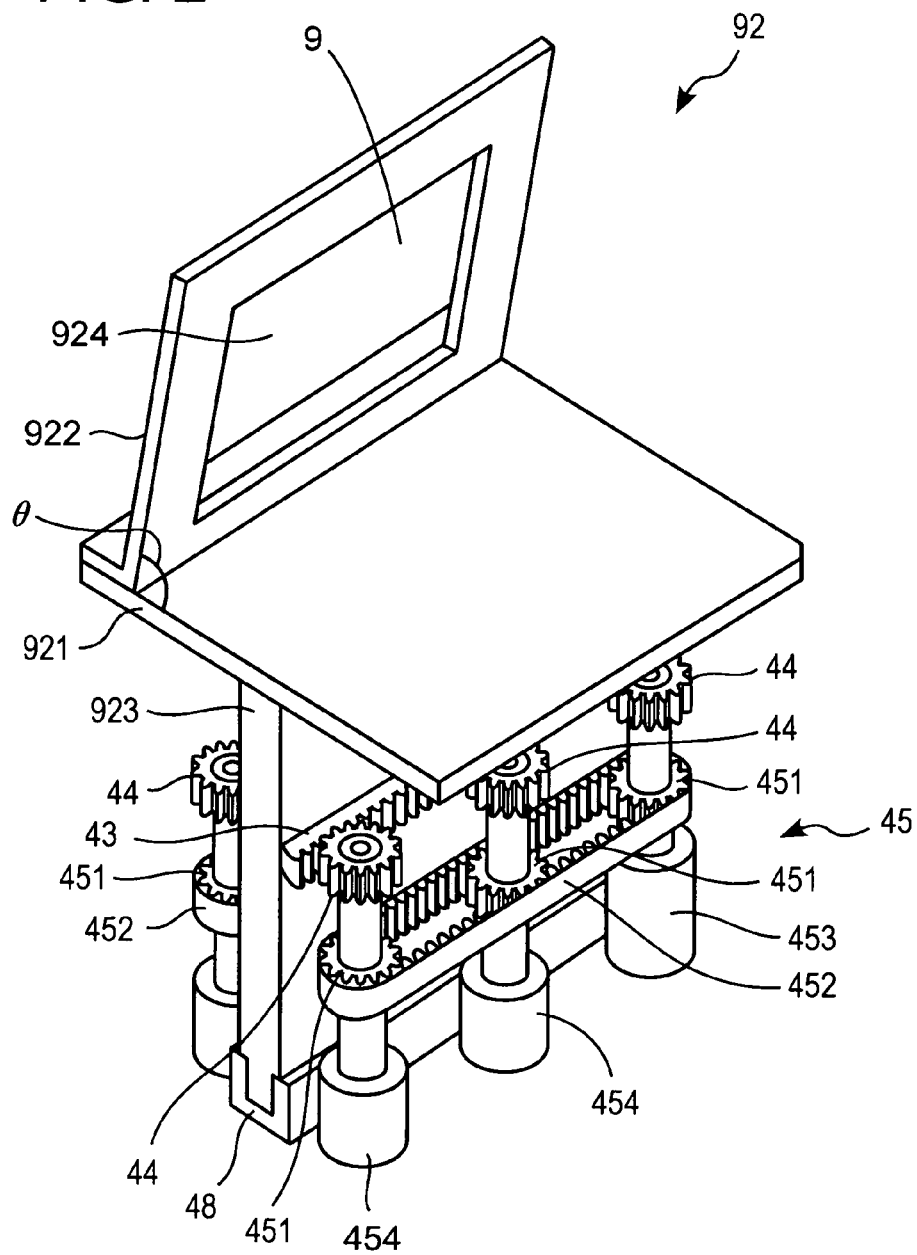
FIG. 2 is a perspective schematic view of a left substrate holder of an embodiment of the present invention.
Figure 3:
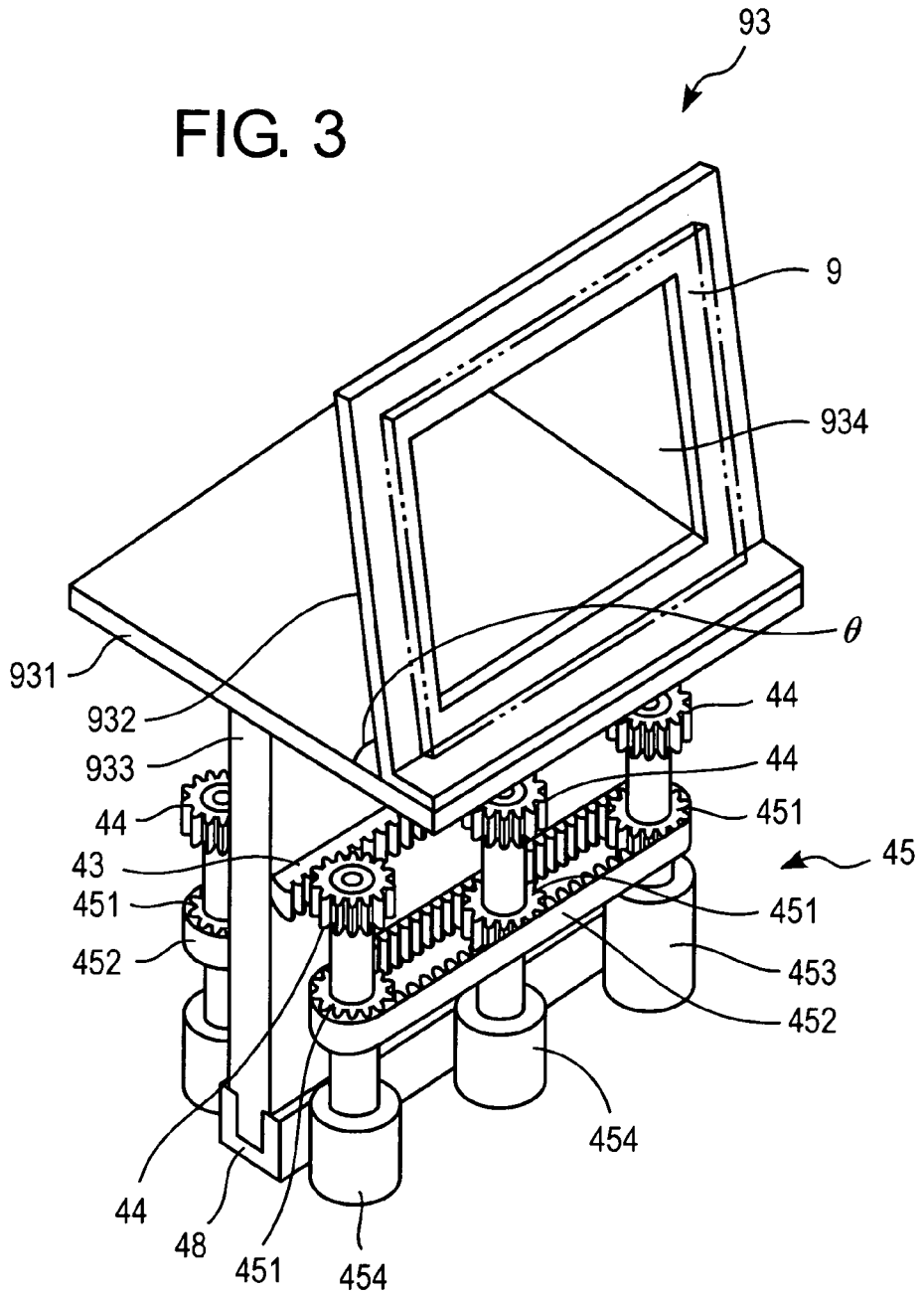
FIG. 3 is a perspective schematic view of a right substrate holder of an embodiment of the present invention.

A description follows, with reference to FIG. 2 and FIG. 3, of the configuration of the transfer system of the device shown in FIG. 1.

In the present embodiment mode, the substrate 9 is carried and processed while held vertical or at an angle approaching vertical. More specifically, the transfer system comprises a substrate holder which holds the substrate 9 upright in such a way that the plate surface thereof forms an angle of holding to the horizontal of between 45° and 90° and a horizontal movement mechanism which moves the substrate holder in the horizontal direction to carry the substrate 9.

In the preferred embodiment, two kinds of substrate holders of slightly different configurations are employed. The two types of substrate holders are different only in the point that the substrate is held on a different side with respect to the direction of carry and, apart from this, the configurations thereof are identical. Hereafter, for convenience of explanation, as required, the substrate holder which holds the substrate on the left-side with respect to direction of carry will be referred to as the left substrate holder, and the substrate holder which holds the substrate on the right-side will be referred to as the right substrate holder. FIG. 2 is a perspective schematic view of the left substrate holder and FIG. 3 is a perspective schematic view of the right substrate holder.

First, a description will be given, with reference to FIG. 2, of the left substrate holder.

A left holding substrate tool 92 shown in FIG. 2 is configured principally from a horizontal intermediate plate 921, receiver plate 922 fixed to the intermediate plate 921, and a support plate 923 extending from below the bottom surface of the intermediate plate 921. The intermediate plate 921 is rectangular (oblong or square). The bottom edge of the receiver plate 922 is bent and the section that is bent (hereinbelow the bottom edge part) is fixed along the left edge of the intermediate plate 921. The rest of the receiver plate 922 extends upward. The upward-extending section of the receiver plate 922 (hereinbelow the principal part) is not vertical and is inclined slightly from the center. That is to say, the angle of the principal part of the receiver plate 922 (shown as θ in FIG. 2) with respect to the horizontal is formed to be between 45° and 90°.

As shown in FIG. 2, a square opening 924 is provided in the principal part of the receiver plate 922. It is assumed that in the preferred embodiment, a square substrate 9 will be carried and processed. The substrate 9 is slightly larger than the opening 924 of the receiver plate 922. The bottom edge of the substrate 9, as shown in FIG. 2, is mounted on the bottom edge part of the receiver plate 922, and is supported by the receiver plate 922 in a form (in a leaning form) in which the plate surface has contact with the principal part of the receiver plate 922. It will be noted that the substrate 9 is held in a position that blocks the opening 924 of the receiver plate 922.

The plate surface of the substrate 9 on the side that does not contact the receiver plate 922 constitutes the nonprocessing surface. In FIG. 2, the direction of carry of the substrate is the direction, on the paper surface, diagonally upward to the right. Accordingly, the left substrate holder 92 is supported so that the plate surface that constitutes the nonprocessing surface of the substrate 9 faces to the left-side with respect to the direction of the carry.

In addition, the upper edge surface of the support plate 923, which extends vertically downward, is fixed to the center of the bottom surface of the intermediate plate 921. Looking from the side, the support plate 923 and intermediate plate 921 form a T-shape. The direction of the side of the support plate 923 fixed to the intermediate plate 921 is parallel to the side of the intermediate plate 921, and the upper edge and lower edge of the held substrate 9 is also parallel therewith.

Next, with reference to FIG. 3, a description will be given of the configuration of the right substrate holder 93. The right substrate holder 93, in the same way, is principally configured from a horizontal intermediate plate 931, a receiver plate 932 fixed to the intermediate plate 91, and a support plate 933 extending from below the bottom surface of the intermediate plate 931. As is clear by comparison between FIG. 2 and FIG. 3, the right substrate holder 93 is different from the left substrate holder 92 only in terms of the position at which the receiver plate 932 is fixed. That is to say, the receiver plate 932 for the right substrate holder 93 is fixed to the intermediate plate 931 in such a way as to be aligned on the opposite right-side to the receiver plate 922 of the left substrate holder 92. In addition, the upper part of the receiver plate 932 of the right substrate holder 93 is not vertical and is inclined a little from the center. The angle of incline θ is the same as the receiver plate 922 of the left holding substrate tool 92. Apart from this the configurations are identical.

In FIG. 3, the direction of carry, which is the same as FIG. 2, is established, in the paper surface, in the upper-right diagonal direction. As is clear from FIG. 3, the nonprocessing surface of the substrate held by the right substrate holder 93 faces toward the left-side with respect to the direction of carry.

The horizontal movement mechanism, which moves the above-described left substrate holder 92 and right substrate holder 93 horizontally, is provided along a carry line established in the horizontal surface. The horizontal movement mechanism comprises a longitudinal movement mechanism which moves the substrate holders 92, 93 in the direction of the longitudinally-provided processing chambers 21, 22, 23 (hereinbelow longitudinal direction), and a lateral movement mechanism which moves the substrate holders 92, 93 in the lateral direction which constitutes a direction horizontal and perpendicular to the longitudinal direction.

A description will be given, with reference to FIG. 2 and FIG. 3, of the configuration of the longitudinal movement mechanism. The longitudinal movement mechanism of the preferred embodiment moves the substrate holders 92, 93 in the longitudinal direction using a rack and pinion mechanism. More specifically, a rack 43 is provided on the side surface of both sides of the support plates 923, 933. The direction in which the rack 43 extends, which is the horizontal direction, matches the direction of the side of the above-described intermediate plates 921, 931.

The longitudinal movement mechanism is configured from a plurality of pinions 44 that engage with the above-described rack 43, and a pinion drive mechanism 45 that drives the pinions 44. The pinion drive mechanism 45 is principally configured from drive gears 451 linked to each pinion 44 by way of a drive shaft, a timing belt 452 which spans the drive gears 451, a motor 453 linked with one drive gear 451, and a bearing 454 which receives the drive shaft of the remaining drive gears 451.

In FIG. 2 and FIG. 3, when the motor 453 is operated, the drive gears 451 are rotated by way of the timing belt 452, and this rotation is transmitted to the pinions 44 by the drive shaft. In addition, the rack 43 is moved directly in the horizontal direction by the rotation of the pinions 44, wherein the support holders 92, 93 are also moved in a straight line, as a whole, in the longitudinal direction. As a result, the substrate 9 held by the substrate holders 92, 93 is carried.

In addition, as shown in FIG. 2 and FIG. 3, a guide rail 48 is provided which guides the movement of the substrate holders 92, 93 and supports the entirety of the substrate holders 92, 93. The guide rail 48 comprises a groove which supports the bottom edge of the support plates 923, 933. This constitutes a long member in the longitudinal direction of the support substrate tools 92, 93. A bearing or the like, not shown in the diagram, is provided in the inner surface of the guide rail 48 which affords a smooth movement of the bottom edge of the support plates 923, 933. It will be noted that the adoption of a magnetic levitation mechanism is suitable because, if the bottom edge of the support plates 923, 933 and the guide rail 48 do not contact, it will prevent the generation of dust and dregs and so on.

The longitudinal movement mechanism of this kind is provided in the load station not shown in the diagram, the left and right load-lock chamber 11L, 11R, the intermediate chamber 7, the processing chambers 21, 22, 23 and the inversion chamber 8. The substrate holders 92, 93 are moved in the longitudinal direction by the operation of the longitudinal movement mechanism at each position as appropriate.

Figure 4:
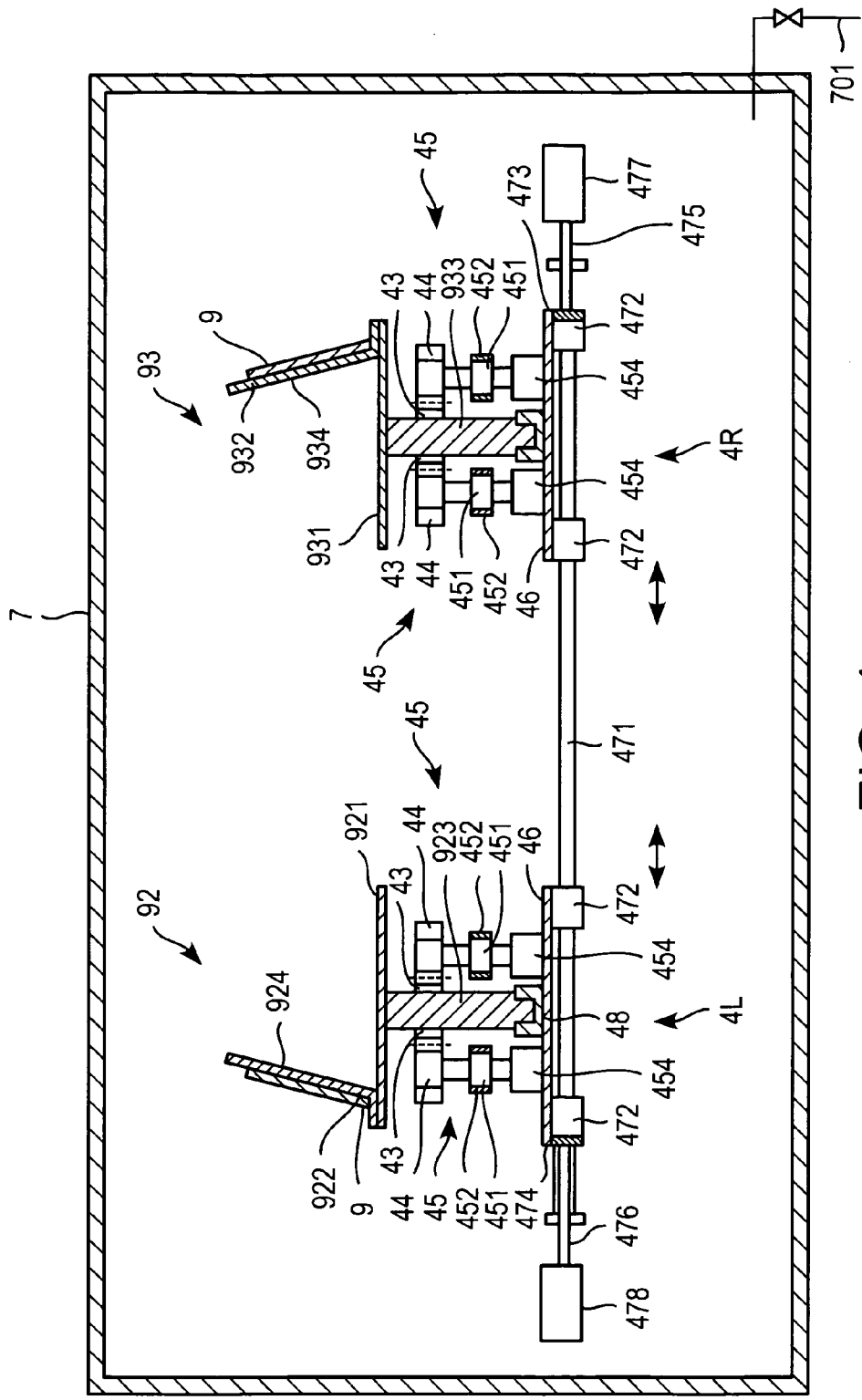
FIG. 4 is a cross-sectional schematic view of an intermediate chamber 7 shown in FIG. 1.

Next, a description will be given, with reference to FIG. 4, of the configuration of the intermediate chamber 7 and inversion chamber 8. FIG. 4 is a cross-sectional schematic view of the intermediate chamber 7 shown in FIG. 1. The configuration of the intermediate chamber 7 and the configuration of the inversion chamber 8 are approximately the same.

The intermediate chamber 7 is formed as a through-space for carry of the substrate 9 between the three longitudinally-provided processing chambers 21, 22, 23 and the two load-lock chambers 11L, 11R. The inner space of the intermediate chamber 7 is pumped out by a pumping system 701. The above-described lateral movement mechanism is provided within the intermediate chamber 7.

More specifically, as shown in FIG. 4, two longitudinal movement mechanisms comprising the pinions 44, pinion drive mechanisms 45 and guides rail 48 are provided at the left and right within the intermediate chamber 7. The lateral movement mechanisms are respectively provided in the left and right longitudinal movement mechanisms and are formed to integrally move the longitudinal movement mechanisms in the lateral direction in a straight line. In the description below, the longitudinal movement mechanism provided in the left-side within the intermediate chamber 7 is taken to be the left-side longitudinal movement mechanism 4L, and the longitudinal movement mechanism provided in the right-side is taken to be the right-side longitudinal movement mechanism 4R.

Figure 5:
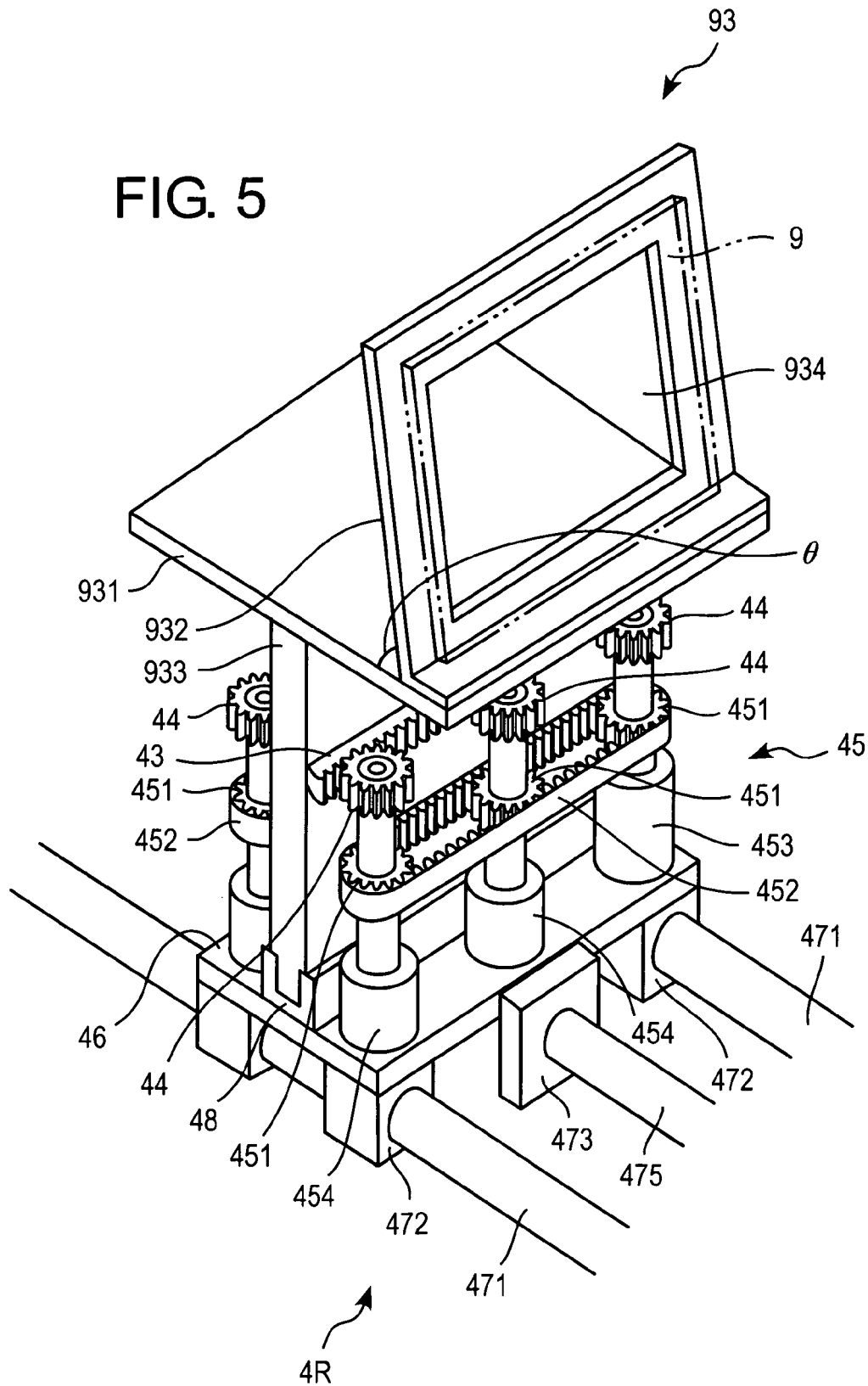
FIG. 5 is a perspective schematic view of a longitudinal movement mechanism and a lateral movement mechanism within the intermediate chamber 7.

FIG. 5 is a perspective schematic view of the longitudinal movement mechanism and lateral movement mechanism within the intermediate chamber 7. FIG. 5, as one example thereof, shows the right-side longitudinal movement mechanism 4R and lateral movement mechanism that moves this in the lateral direction. In addition, FIG. 5 shows a state in which the right substrate holder 93 is positioned on the right-side longitudinal movement mechanism 4R.

As is shown in FIG. 4, the lateral movement mechanism is configured from base plates 46, in which the longitudinal movement mechanisms 4L, 4R are fixed on the upper surface, guide rods 475, 476 fixed to the base plate 46, and straight-line drive sources 477, 478 which drive the base plates 46 in a straight line by way of the guide rods 475, 476. The assembly of an air cylinder or motor and ball screw or the like is used in the straight-line drive sources 477, 478.

The base plates 46, in which the vertical drive mechanisms are fixed, are horizontally provided on the same horizontal surface. As shown in FIG. 4 guide rods 471 are provided at the bottom side of the base plates 46. As shown in FIG. 5, the guide rods 471, provided in parallel, extend in the lateral direction. The interval between the two guide rods 471 is slightly shorter than the width of the base plates 46. In addition, linear bearings 472, in which the guide rods 471 are inserted, are provided at the bottom surface of the base plates 46. The linear bearings 472 are provided at the bottom surface of the base plates 46 in the four corners thereof.

In addition, as shown in FIG. 4, a right-side drive rod 475 is fixed to the right edge of the base plate 46 of the right-side movement mechanism 4R by way of a right-side fixing plate 473, and a left-side drive rod 476 is fixed to the left edge of the base plate 46 of the left-side longitudinal movement mechanism 4L by way of a left-side fixing plate 474. A right-side straight-line drive source 477 such as an air cylinder is connected to the right-side drive rod 475, and a similar left-side straight-line drive source 478 is connected to the left-side drive rod 476. It will be noted that the left and right straight-line drive sources 477, 478 are provided at the outer side of the intermediate chamber 7. The left and right drive rods 475, 476 pass through the intermediate chamber 7 (not shown in FIG. 4 and FIG. 5) to link with the straight-line drive sources 477, 478. A vacuum seal not shown in the diagram, such as a mechanical seal that employs a magnetic fluid, is provided in the position of penetration of the drive rods 475, 476.

When the right-side straight-line drive source 477 is operated, the whole of the right-side longitudinal movement mechanism 4R, while guided by the guide rod 471, is moved in a straight line in the lateral direction by way of the right-side drive guide rod 475. As a result, the substrate holder 93 on the right-side vertical drive mechanism 4R is also integrally moved, and the substrate 9 supported on the substrate holder 93 is carried in this direction. In addition, when the left-side straight-line drive source 478 is operated, the whole of the left-side longitudinal movement mechanism 4L, while being guided by the guide rod 471, is moved in a straight line in the lateral direction by way of the left-side drive rod 476. As a result, the substrate holder 92 on the left-side longitudinal movement mechanism 4L is integrally moved, and the substrate 9 held on the substrate holder 92 is carried in this direction. It will be noted that the inversion chamber 8 comprises a similar configuration to the lateral movement mechanism within the intermediate chamber 7 described above.

Next, a description will be given, again with reference to FIG. 1, of the carry line based on the carry system of the above-described configuration. The device of the preferred embodiment is an interback-type device in which the substrate 9 within the device is inverted and returned to the same side. In the description of the transfer line given below, the transfer line to the position of inversion is called the outward transfer line, and the transfer line from the position of the inversion to return is called the return transfer line.

As shown in FIG. 1, although there is one outward transfer line 94, the return transfer line branches to the left and right in the inversion chamber. Hereafter, the branched return transfer line on the left-side will be referred to as the left-side return transfer line 95L, and the return transfer line on the right-side will be referred to as the left-side return transfer line 95R.

As shown in FIG. 1, the outward carry line 94 and the two return transfer lines 95L, 95R are parallel. In addition, both return transfer lines 95L, 95R are parallel with each other. In addition, the three transfer lines 94, 95L and 95R are established so as to pass through the three longitudinally-provided processing chambers 21, 22, and 23.

In the preferred embodiment, although the left substrate holder 92 and right substrate holder 93 are moved to the position of inversion through the same outward transfer line 94, the left substrate holder 92 returns to the intermediate chamber 7 through the left-side return transfer line 95L, and the right substrate holder 93 returns to the intermediate chamber 7 through the right-side return transfer line 95R.

FIG. 6 is a diagram for explaining the movement of the substrate holders 92, 93 along the transfer lines 94, 95L and 95R. FIG. 6(1) indicates the movement of the left substrate holder 92 and FIG. 6(2) indicates the movement of the right substrate holder 93. First, a description will be given, with reference to FIG. 6(1), of the movement of the left substrate holder 92. Although the left substrate holder 92 is transferred through fundamentally the same transfer line within the device, two transfer lines are provided between the atmospheric side and intermediate chamber 7 side. That is to say, a transfer line which performs transfer-in and transfer out by way of the left-side load unlock chamber 11L is shown by the straight line in FIG. 6(1), and a transfer line which performs transfer-in and transfer out by way of right-side load unlock chamber 11R is shown by the dotted line.

A description will be given of the movement of the left substrate holder 92 through, as an example, the left load unlock chamber 11L shown by the straight line. The left substrate holder 92 is moved to the intermediate chamber 7 passing from a load station not shown in the diagram through the left-side load unlock chamber 11L. After this it veers to the right within the intermediate chamber 7 and reaches a center position within the intermediate chamber. The left substrate holder 92 is moved from the center position within the intermediate chamber along the outward transfer line 94 and passes through the center of the three processing chambers 21, 22, 23 in sequence before reaching the center of the inversion chamber 8. After this it veers to the left side in the lateral direction in the inversion chamber 8 before reaching a position slightly to the left within the inversion chamber 8. After this it is moved from the position at the left of the inversion chamber 8 along the left-side return transfer line 95L and passes through the three processing chambers 23, 22, 21 in sequence before reaching a position at the left in the intermediate chamber 7. After this it is returned to the load station, not shown in the diagram, passing from the position at the left in the intermediate chamber through the left-side load-lock chamber 11L.

The movement of the right substrate holder 93 between the atmosphere and the intermediate chamber 7 is, similarly, performed by way of either of the load-lock chambers 11L, 11R. That is to say, the line passes through the right-side load-lock chamber 11R as shown by the straight line in FIG. 6(2) or through the left-side load-lock chamber 11L as shown by the dotted line. A description will be given of the movement of the right substrate holder 93 through, as an example, the right-side load-lock chamber 11R.

As shown by the straight line in FIG. 6(2), the right substrate holder 93 is moved to a position within the intermediate chamber 7 after passing through the right-side load-lock chamber 11R from a load station not shown in the diagram. After this it veers to the left within the intermediate chamber 7 before reaching a center position within the intermediate chamber 7. After this the right substrate holder 93 is moved from the center position within the intermediate chamber along the outward carry line 94 passing through the center of the three processing chambers 21, 22, 23 in sequence before reaching the center of the inversion chamber 8. After this it veers to the right-side in the lateral direction in the inversion chamber 8 before reaching a position to the right within the inversion chamber 8. After this, it is moved from the position to the right of the inversion chamber 8 along the right-side return carry line 95R passing through the three processing chambers 23, 22, 21 in sequence before reaching a position at the right of the intermediate chamber 7. After this it passes from the position at the right of the intermediate chamber 7 through the right-side load-lock chamber 11R to return to a load station not shown in the diagram.

Next, with reference to FIG. 7, a description will be given of the configuration within the processing chambers 21, 22, and 23. FIG. 7 is a cross-sectional schematic view of the processing chamber 21 shown in FIG. 1.

As shown in FIG. 7, a pumping system 201 and gas-introducing system 202 are provided to maintain the inner part of the processing chamber 21 at a predetermined atmosphere. In addition, the processing chamber 21 comprises a processing means 203 that enables processing to be performed on the substrate 9 positioned therein.

The configuration of the processing means 203 is optimized in accordance with the details of the processing to be performed on the substrate 9. By way of example, where a film is to be deposited by sputtering, a sputtering cathode is provided as the processing means 203. The sputtering cathode includes a cathode provided to be exposed to a sputtering surface within the processing chamber 21, and a magnetic unit provided at the rear of the target. The magnetic unit performs magnetron sputtering. Connection is provided to a sputtering power source for imparting a negative direct current voltage or high frequency voltage to the target. When a negative direct current voltage or high frequency voltage is imparted to the target while a sputtering gas such as argon is introduced by a gas-introducing system, a sputtering discharge is produced and the target is sputtered. The thin-film of target material that has been sputtered reaches the surface of the substrate 9, and the thin-film of the target material is accumulated thereon. For uniformity of this process, it is preferable that the target be provided parallel with the substrate 9.

In addition, the adoption of a configuration for performing film-deposited processing using CVD (chemical vacuum deposition) is available. The configuration in this case is a gas-introducing system that introduces a source gas to be used for film deposition using a gas-phase reaction. Where plasma CVD is to be performed, a plasma formation means for forming source gas plasma is adopted as the processing means 203. Where plasma is formed using high frequency discharge, a high frequency discharge in which there is connection with a high frequency power source is adopted as the plasma formation means. It is preferable that this high frequency electrode, in order to produce uniform processing, be provided parallel with the substrate 9. A gas-phase reaction within the source gas plasma is used and a thin-film is produced on the surface of the substrate 9. By way of example, where an amorphous silicon film is to be produced, a mixture of silane and hydrogen gas is introduced as the source gas, and a hydrogenated amorphous silicon film is produced on the surface of the substrate by the plasma CVD. In addition to this, film-deposition using heated CVD is also available.

Etch processing is also available. Where etch processing is performed, a gas that has an etch action, such as a fluorine-based gas, is introduced. When plasma etch is performed, similarly, the plasma is formed using a high frequency discharge, and etching of the surface of the substrate 9 using active species or ions generated within the plasma is performed. In this case, similarly, the processing means 203 may be a high frequency electrode.

A significant feature of the processing chamber 21 of the preferred embodiment lies in the provision of a heater 204 which can heat the substrates positioned on the outward carry line 94. The substrate 9 positioned on the return carry lines 95L, 95R is processed. That is to say, as shown in FIG. 7, a heater 204 is provided within the processing chamber 21.

A ceramic heater is used as the heater 204 in the preferred embodiment. The heater 204 is a panel type and is affixed to the upper wall part of the processing chamber 21 by a heater attachment 205. The heater attachment 205 attaches two heaters 204. The two heaters 204 are arranged surface-symmetrically with respect to a vertical surface passing through the center of the processing chamber 21. In addition, the left-side heater 204 is affixed to be parallel to the substrate 9 held on the left substrate holder 92, and the right-side heater 204 is attached to be parallel to the substrate 9 held on the right-side holder 93.

It will be noted that, as shown in FIG. 7, three movement mechanisms 4c, 4l and 4r are provided in the processing chamber 21. The center longitudinal movement mechanism 4c is used to carry the substrate holder 92, 93 along the outward carry line 94 shown in FIG. 6. In addition, the left-side longitudinal movement mechanism 41 carries the left substrate holder 92 along the left-side return carry line 95L shown in FIG. 6, and the right-side longitudinal movement mechanism 4r carries the right-side carry tool 93 along the right-side return carry line 95R shown in FIG. 6.

The configurations of the second and third processing chambers 22, 23 are the same as the first processing chamber shown in FIG. 7. It will be noted that, it goes without saying, a processing means different from that of the first processing chamber 21 can be used as the processing means 203.

Next, with reference to FIG. 8, a description will be given of the operation of the entire device of the present embodiment mode pertaining to the above-described configuration. FIG. 8 is a diagram for explaining the operation of the device of the present embodiment mode. In FIG. 8, the operation advances in the order of (1)–(4) are as shown. The device of the preferred embodiment, as is clear from the description provided above, performs processing by mounting substrates 9 on the substrate holders 92, 93, and transferring the substrate holders 92, 93 in sequence through the chambers 11L, 11R, 7, 21, 22, 23 and 8. In the description given below, the state shown in FIG. 8(1) is described as the initial state.

In the state shown in FIG. 8(1), within the first processing chamber 21, a left substrate holder 92 is positioned on the left-side return transfer line 95L, a right substrate holder 93 is positioned on the right-side return transfer line 95R, and another left substrate holder 92 is positioned on the outward transfer line 94. In the second processing chamber 22, a left substrate holder 92 is positioned on the left-side return transfer line 95L, a right substrate holder 93 is positioned on the right-side return transfer line 95R, and a right substrate holder 93 is positioned on the outward transfer line 94. In the third processing chamber 22, a left substrate holder 92 is positioned on the left-side return transfer line 95L, a right substrate holder 93 is positioned on the right-side return carry line 95R, and a left substrate holder 92 is positioned on the outward carry line 94.

In addition, in the intermediate chamber 7, a left substrate holder 92 is positioned in a position at the left thereof, and a right substrate holder 93 is positioned in a position at the right thereof. The substrate holders 92, 93 positioned in the intermediate chamber 7 hold unprocessed substrates 9.

In the state shown in FIG. 8(1), processing is performed on the substrates 9 within the processing chambers 21, 22, 23. That is to say, the substrates 9 held on the left substrate holders 92 on the left return carry line 95L and the substrates 9 held on the right substrate holders 93 of the right return carry line 95R are simultaneously processed in the processing chambers 21, 22, 23. At this time, characteristically, heat processing is simultaneously performed using the heater 204 on the substrates 9 held on the substrate holders 92, 93 on the outward line 94.

At a later time, the device is in the state shown in FIG. 8 (2). That is to say, the left substrate holder 92 on the outward carry line 94 within the third processing chamber 23 moves to the chamber 8 and veers to the left, and then stops at a position to the left within the inversion chamber 8. In addition, the right substrate holder 93 on the outward carry line 94 within the second chamber 22 reaches the inversion chamber 8 by way of the third processing chamber 23 and veers to the right, and then stops at a position to the right within the inversion chamber 8.

Next, as seen in FIG. 8(3), the left substrate holder 92 on the outward carry line 94 within the first processing chamber 21 progresses along the outward carry line 94 by way of the second processing chamber 22 to the third processing chamber 23. The right substrate holder 93 in the position at the right of the intermediate chamber 7 progresses from the center position of the intermediate chamber along the outward carry line 94 and, by way of the first processing chamber 21, progresses to the second processing chamber 22. Next, the left substrate holder 92 in a position at the left within the intermediate chamber 7 passes through the center position of the intermediate chamber 7 and progresses to the outward carry line 94 within the first processing chamber 21. As a result, the device forms the state shown in FIG. 8(3).

Next, as seen in FIG. 8(4), the left substrate holder 92 on the left return carry line 95L within the first processing chamber 21 advances forward to move to a position at the left of the intermediate chamber 7. Simultaneously, the right substrate holder 93 on the right return carry line 95R within the first processing chamber 21 advances forward to move to a position to the right within the intermediate chamber 7.

Following this, the left substrate holder 92 on the left return carry line 95L within the second processing chamber 22 advances forward to move into the first processing chamber 21. Simultaneously, the right substrate holder 93 on the right return carry line 95R within the second processing chamber 22 advances forward to move into the first processing chamber 21.

Furthermore, following this, the left substrate holder 92 on the left return carry line 95L within the third processing chamber 23 advances forward to move into the second processing chamber 22. Simultaneously, the right substrate holder 93 on the right-side return carry line 95R within the third processing chamber 23 advances forward to move into the second processing chamber 22.

Following this, the left substrate holder 92 in the inversion chamber 8 moves to the third processing chamber 23 along the left return carry line 95L, while the right substrate holder 93 in the inversion chamber 8 moves to the third processing chamber 23 along the right return carry path 95R. As a result, the state shown in FIG. 8(4) formed.

In the state shown in FIG. 8(4), because the processing of the substrates 9 which are supported by the substrate holders 92, 93 within the intermediate chamber 7 has been completed, a carry-out operation is performed to discharge the substrate outside the device. By way of example, as described above, the left substrate holder 92 within the intermediate chamber 7, by way of the left-side load-lock chamber 11L, is carried out to a load station not shown in the diagram on the atmospheric side, and the right substrate holder 93, by way of the right-side load-lock chamber 11R, is carried out to a load station not shown in the diagram on the atmospheric side.

Following this, in the load station not shown in the diagram, unprocessed substrates 9 are respectively mounted on the left substrate holder 92 and the right substrate holder 93. In addition, these substrates are carried into the device by way of either the load-lock chamber 11L or 11R. The two substrate holders 92, 93 reach the intermediate chamber 7 wherein the state shown in FIG. 8 (1) is formed again. In this state, the next stage of processing is performed. In addition, when the processing has been completed, the operations of FIG. 8(2)–(4) are repeated again. It will be noted that, from the viewpoint of improvements to productivity, it is preferable that the carry-in and carry-out operation of the substrate 9 be performed in parallel throughout the processing in the processing chambers 21, 22, and 23.

In this way, in each stage, the left substrate holders 92 and the right substrate holders 93 which hold only processed substrates 9 are carried out from the device, and the left substrate holder 92 and right substrate holder 93 which hold the unprocessed substrates 9 are carried into the device. In addition, the unprocessed substrates 9, in the left or right return carry lines 95L, 95R, are moved in sequence from the third processing chamber 23, second processing chamber 22 and first processing chamber 21 in each single stage time, whereby processing is continuously performed.

Furthermore, the substrate holders 92, 93 which hold the unprocessed substrates 9 are positioned on either the first, second or third processing chambers 21, 22, 23 on the outward carry line 94, wherein a heating of the substrates 9 therein is performed. This heating is a pre-heating that heats the substrate 9, prior to processing, to a predetermined temperature. In this substrate processing, for reasons such as increasing the processing speed, the processing must be performed in a state in which the substrate 9 is heated to a predetermined temperature higher than room temperature. In a case, where heating is performed after the substrate has been carried into the processing chambers 21, 22, 23, time is required for the processing to begin again and productivity is lowered. However, in the configuration of the preferred embodiment, because pre-heating is performed on the outward carry line 94 prior to processing within the processing chambers 21, 22, 23 there is no reduction in productivity.

It will be noted that, as is clear from the above description, the substrate held on the left substrate holder 92 is heated in the first processing chamber 21 and third processing chamber 23 (that is to say, it is heated for two-stage time period). On the other hand, the substrate 9 held on the right substrate holder 93 is heated for a single stage time period only within the second processing chamber 22. Accordingly, from the viewpoint of uniformity of heating, it is preferable that the heat amount based on the heater 204 within the first and third processing chambers 21, 23 be half that of the heater 204 within the second processing chamber 22. However, if four processing chambers are provided, because the substrate 9 of the substrate holders 92, 93 is heated for the same 2-stage time, the heat amount of the heaters 204 may be the same.

In the above-described operation, although the gate valves 10 are opened as the substrate holders 92, 93 are passed through, at other times they are closed. In addition, it is preferable that, prior to the opening of the gate valves 10, the processing chambers 21, 22, 23 are adequately pumped out by a pumping system. This is to prevent dispersion of atmospheric gases to the other chambers.

In addition, in the above-described operation, the movement of the substrate holders 92, 93 in the longitudinal direction is performed by the above-described longitudinal movement mechanism. That is to say, the pinion drive mechanisms 45 are operated simultaneously to move the substrate holders 92, 93. The movement in the lateral direction of the substrate holders 92, 93 in the intermediate chamber 7 and the inversion chamber 8 is performed by the above-described lateral movement mechanism.

In addition, where movement in the lateral direction is performed following movement in the longitudinal direction (or the reverse thereof), two longitudinal movement mechanisms are driven so as to form a straight line on the longitudinal-direction transfer lines. This point describes, by way of example, the case where the left substrate holder 92 that holds the unprocessed substrate 9 is moved to the first processing chamber 21 through the center positions of the left-side load lock chamber 11L and intermediate chamber.

The left-side movement mechanism 4L shown in FIG. 4 is positioned in advance in a position aligned on the same linear line as the longitudinal movement mechanism within the left-side load lock chamber 11L. In this state, the longitudinal movement mechanism within the left-side load lock chamber 11L and the left-side longitudinal movement mechanism 4L within the intermediate chamber 7 are simultaneously operated, wherein the left substrate holder 92 is transferred to the left-side movement mechanism 4L within the intermediate chamber 7 from the longitudinal movement mechanism within the left-side load lock chamber 11L. At the point when the substrate holder 92 reaches a predetermined position on the base plate 46 of the left-side longitudinal movement mechanism 4L, the operation of the pinion drive mechanisms 45 is stopped.

In addition, the left-side straight-line drive source 478 shown in FIG. 4 is operated again, and the substrate holder 92 is shifted to a center position of the intermediate chamber 7. By virtue of this, the center longitudinal movement mechanism 4c within the first processing chamber 21 and the left-side longitudinal movement mechanism 4L within the intermediate chamber 7 are aligned in one line. In this state, the longitudinal movement mechanism 4c within the first processing chamber 21 and the left-side longitudinal movement mechanism 4L within the intermediate chamber 7 are simultaneously operated, and the left substrate holder 92 is transferred into the first processing chamber 21.

In the above-described operation, although the left-side load lock chamber 11L is used for carry-in and transfer out of the substrate 9 that is held by the left substrate holder 92, and the load lock chamber 11R is used for transfer-in and transfer out of the substrate 9 held by the right substrate holder 93, this is not limited thereto. The left load-lock chamber 11L may be used for carry-in of the unprocessed substrate 9, and the right-side load lock chamber 11R may be used for the transfer-out of the processed substrate 9. There are no limitations to the left and right substrate holders 92, 93 and they may be employed jointly for both transfer-in and transfer out of the substrate.

The device of the preferred embodiment pertaining to the configuration and action described above comprises the following noteworthy technological significance.

First, the device of the preferred embodiment is, as described above, an interback-type, that is to say, the configuration is one in which the substrate 9 is inverted within the device and returned to the same side. In an interback-type device, the transfer-in and transfer-out of the substrate is performed in the device on the same side of the substrate. Accordingly, this has merit in that assembly on existing manufacturing lines is simple.

However, in interback-type devices of the prior art, because the substrate 9 is returned through the same carry line, where a plurality of processing chambers are longitudinally-provided, repetition of exactly the same kind of processing is excluded and processing cannot be performed within the processing chambers during the return of the substrate 9. Accordingly, interback-type devices have been widely employed in only limited use, such as experimental devices.

There are additional drawbacks with interback-type devices of the prior art in that, when the number of processing steps is increased to increase the number of processing chambers, in the same way as inline-type devices, the length in the line direction is increased. In the configuration of the preferred embodiment, the number of processing steps can be increased without an increase to the length in the line direction. Within interback-type device carry lines, the return carry line is a path that is different than the outward carry line 94, and the return carry line is branched in plurality. By the adoption of the return carry line as a path that is different than the outward carry line 94, processing can be performed on the substrate 9 irrespective of whether the processing is the same or different on the return carry line, and the number of processing steps can be increased. In addition, and because the return carry line thereof is divided into two branches, processing can be performed when the substrates 9 are passed through the two return carry lines 95L, 95R and returned, and productivity can be significantly increased.

It will be noted that, the configuration may be one in which the return carry lines 95L, 95R are a different path than the outward carry line 94, wherein an effect of an increased number of processing steps is obtained. However, in another embodiment, the right-side return carry line 95R may be dispensed with and all the substrates may be returned through a left-side carry line 95L. In addition, in this case, only left substrate holders 92 are used.

In addition, the configuration in which the outward carry line 94 and return carry lines 95L, 95R are parallel is technologically significant in that the layout of the chambers is reformed, and an unnecessary increase in occupied space in the lateral direction is suppressed. Similarly, the point whereby the branched return carry lines 95L, 95R are parallel with each other is technologically significant in that the layout of the chambers is reformed and an unnecessary increase of the occupied space in the lateral direction is suppressed. Nevertheless, the adoption of nonparallel outward carry line 94 and return carry lines 95L, 95R, and a nonparallel branched outward carry line 94 or return carry lines 95L, 95R is not excluded from the invention of the present application.

In addition, in the preferred embodiment, as described above, the outward carry line 94 and return carry lines 95L, 95R are established so as to pass through the same processing chambers 21, 22, 23, and heat-processing is performed in the outward carry line 94. This configuration has technological significance in that an increase in the number of chambers is suppressed and a resultant increase in complexity of the structure of the device is avoided.

It is normal for, where the number of processing steps is increased, the processing chambers to be increased by that amount. In the configuration of the present embodiment mode, the division of the processing chambers 21, 22, 23 into three lines in the lateral direction and the adoption of a total of nine processing stations has been considered. In this case, a pumping system and gas-introducing system may be separately provided in the processing chamber to independently control the atmospheric gas, respectively different processing can be performed (however, in reality, because the processing chambers on the return transfer lines 95R, 95R perform the same processing on both sides, the number of processing steps is increased by three to six).

However, when the processing chambers are increased in this way, the structure is more complex and the number of openings and closings of the gate valves and so on is increased, resulting in a more complex operation. In the preferred embodiment, because the processing of the outward transfer line 94 is limited to heat processing, the number of processing steps is increased without an increase in the number of processing chambers. Naturally, dependent upon the type of gas used in the processing chambers 21, 22, and 23, there may be problems during heating such as soiling of the substrate 9.

By way of example, where a chemically active gas is used in the processing chambers and, when the substrate 9 is heated on the outward transfer line 94, sometimes a modification of the surface of the substrate occurs which is caused by a gas-phase reaction or the like. When this becomes a problem the adoption of the configuration of the preferred embodiment is difficult. However, in the case where a chemically stable gas such as nitrogen or argon is used and the substrate 9 is a comparatively stable material such as glass, the configuration of the preferred embodiment can be effectively adopted.

It will be noted that the above-described effects of simplifying the structure and operation will be obtained if the outward carry line 94 and at least one of the return carry lines are established to pass through a common processing chamber. However, the effect thereof is further enhanced when these lines are established so as to pass through three common processing chambers 21, 22, and 23 as in the preferred embodiment.

In addition, in the above-described preferred embodiment, although the process performed on the return carry lines 95L, 95R may require heating, a cooling process may also be performed thereon. For performing this cooling process, configurations have been considered in which a low-temperature block cooled to a predetermined low-temperature is brought into contact with the substrate holders 92, 93 and cooling is provided through the substrate holder 92, or in which direct cooling is performed by contact of the low-temperature block with the rear surface of the substrate 9. It will be noted that there are cases in which, based on the contents of the processing, processing other than heating or cooling can be performed on the outward carry line 94 and return carry lines 95L, 95R within the same processing chambers 21, 22, 23.

In addition, in the above-described preferred embodiment, although the return carry lines are branched in two, the outward carry line 94 may also be branched, wherein both outward and return lines may be branched. Furthermore, in the above-described preferred embodiment, although the branched return carry lines 95L, 95R are positioned on both sides of the outward carry line 94, the branched return carry lines 95L, 95R may be positioned on one side of the return carry lines 95L, 95R.

It will be noted that the heat-processing or cooling-processing of the substrate 9 may be performed in the return carry lines 95L, 95R. More particularly, this refers to a configuration in which processing such as film formation is performed on the outward carry line 94 and which, in actual application, cooling-processing is performed on the return lines 95L, 95R.

The configuration in which the substrate 9 is carried and processed in a state in which it is held vertical or at an angle approaching the vertical comprises a marked effect in terms of suppression of increase of the occupied space of the device. That is to say, because the substrate 9 is carried and processed in a state in which it is vertical or at an angle approaching the vertical, the occupied space of the load-lock chamber 11L, 11R, intermediate chamber 7 and processing chambers 21, 22, 23 is notably less by comparison with a case in which the substrate 9 is horizontally carried and processed. More particularly, where the substrate 9 is carried and processed horizontally, the substrate 9 is enlarged and so the occupied space of the chambers must be enlarged by that amount and, in the preferred embodiment, even though the space in the longitudinal direction must be increased, the occupied space is, essentially, not enlarged. For this reason, the occupied space of the entire device is not enlarged.

There are many instances in which devices such as that of the preferred embodiment are deployed in clean rooms. The increase in the occupied space of the device has a drawback in that it leads to the necessity for a clean room larger by that amount, as well as an increase in working costs and running costs. The device of the preferred embodiment is advantageous in terms of reduction of the work costs and running costs of the clean room because the increase in the occupied space is suppressed.

In addition, the configuration in which the substrate 9 is carried and processed in a state in which it is held vertical or approaching the vertical has noteworthy technological significance in terms of its improvement to the prevention of warp of the substrate 9. That is to say, in the present embodiment mode, because the substrate 9 described above is mounted and held in a state in which it leans with respect to the substrate holders 92, warp thereof, due to its own weight, which occurs when it is held horizontally does not occur. For this reason, there are no concerns about, for example, performance damage to the product of nonuniform processing and display blotches, and cracks of the substrate due to nonuniform residual inner part stresses.

Furthermore, the configuration in which the substrate 9 is carried and processed in a state in which it is held vertical or approaching vertical has technological significance in that the maintenance of the device is easier. As described above, although it is necessary to provide an opening and closing door for maintenance of the inner part in the chambers from which the device is configured, because the occupied space of the chambers is less, even if the opening/closing door is provided in the upper plate part, the opening/closing door will not be that much larger. In addition, because the plate surface of the substrate 9 faces the side direction, the opening/closing door may be provided in the side plate part of the chamber and, in this case, the opening and closing is easy even if a large opening/closing door is provided.

In the above-described embodiment an angle of holding θ of the substrate 9 of between 45° and 90° is adopted. When the angle is 45° or less, this is nearer the horizontal and the technological benefit described above is not as good. It will be noted that, although it is more preferable that θ be an angle in the range of between 70° to 85°. When it is 85° or more, in the state in which it leans with respect to the substrate holding part 92, there are concerns that the holding of the substrate 9 may be inadequate. In other words, the possibility that the substrate 9 will fall due to some kind of shock is increased. Although a separate provision of a clamp mechanism or the like which pushes the substrate 9 against the substrate holding 92 is possible in order to prevent this, this has a drawback in that the structure is more complex, and in that the attachment and the detachment operation of the substrate 9 is more complex. In addition, when the angle is increased to more than 70°, the technological significance of the above-described vertical holding is enhanced.

In addition, the point in which the substrate holders 92, 93 within the intermediate chamber 7 and inversion chamber 8 can be moved in the lateral direction in addition to the longitudinal direction is closely related to the configuration of the above-described carry line. First, with reference to the intermediate chamber 7, because the paths of the outward carry line 94 and return carry lines 95L, 95R are different, the substrate 9 must be collected from the line on which the substrate 9 is provided, and so the substrate holders 92, 93 must be moved in the lateral direction.

In addition, in the inversion chamber 8 as well, movement in the lateral direction is required in order to perform the inversion operation to a different path. Inversion is possible by an operation that affords a 180° inversion of the substrate holders 92, 93 around a vertical rotating axis.

In addition, the distance over which it is possible for the substrate holders 92, 93 within the intermediate chamber 7 to be moved in the lateral direction has technological significance in that the number of load-lock chambers can be increased. That is to say, as in the preferred embodiment, in the case where movement of the substrate 9 in the lateral direction is possible, as in the left and right load-lock chambers 11L, 11R, a plurality of load-lock chambers can be provided in lateral alignment with respect to the intermediate chamber 7 (parallel alignment). When this is done, the efficiency of the carry-in carry out operation of the substrate with the atmospheric side is improved and, as a result, the productivity of the device is also improved.

In addition, in the same way, two or more groups of longitudinally-provided processing chamber groups or two or more processing chambers in the lateral direction can be connected to the intermediate chamber. For this reason, the number of processing chambers can be further increased and the number of processing steps can be increased.

In addition, as in the preferred embodiment, the configuration in which the substrate holders 92, 93 are able to be moved in the lateral direction within the intermediate chamber 7 has technological significance in that a buffer function can be provided within the intermediate chamber 7. That is to say, when there is lateral direction movement only, because the substrate 9 is positioned on the carry line, the substrate 9 is moved only to the processing chamber or is returned from the load-lock chamber to the atmospheric side, and the carry-in or carry-out operation of the next substrate cannot be performed. However, when movement in the lateral direction is possible, the substrate 9 can be caused to retreat to an appropriate retreated position displaced in the lateral direction from the carry line. That is to say, a buffer function can be imparted to the intermediate chamber 7. It will be noted that the technological significance of this is fundamentally the same with the case of one load-lock chamber as well.

In addition, as is described above, the lateral movement mechanism carries the substrate 9 toward the side with respect to the direction of carry of the plate surface. This configuration is technologically significant in that the occupied area of the space in the horizontal direction required for carry is reduced.

That is to say, by adopting a configuration which carries the plate surface of the substrate in a state facing the rear or front with respect to the movement direction, the width of the space required for carry is equivalent to the width of the plate surface of the substrate 9. Accordingly, the size of the space in the horizontal direction required for carry is enlarged by comparison to the preferred embodiment. For this reason, an increase in size of the entire body of the device results; this problem is greater when the substrate 9 is larger. On the other hand, based on the configuration of the preferred embodiment, a problem of this kind does not arise, and the space required for carry in the horizontal direction is minimized.

In addition, the above-described configuration contributes to the simplification of the gate valves 10. That is to say, the configuration in which the plate surface of the substrate 9 is carried in a state facing the front or rear with respect to the direction of movement forms a configuration in which the load-lock chambers 11L, 11R and processing chambers 21, 22, 23 are connected to the intermediate chamber 7 at the long side section of the square outline thereof. For this reason, the size of the opening for the opening and closing of the gates 10 is enlarged. Accordingly, when large drive forces for opening and closing are required the scale of the gate valves 10 is increased. On the other hand, based on the configuration of the preferred embodiment, a problem such as this does not arise, and the gate valves 10 can be simplified.

As is clear from the description above, in the preferred embodiment, normally nine substrate holders 92, 93 are carried into the device and movement of the substrate 9 is performed by way of the left right load-lock chambers 11L, 11R while processing is performed within the processing chambers 21, 22, 23. Accordingly, the productivity is high. It will be noted that a pre-heating of the substrate 9 within the intermediate chamber 7 may be performed.

In addition, a pressure-adjustment chamber function can be provided in the above-described intermediate chamber 7. That is to say, when the pressure difference between the load-lock chambers 11L, 11R and processing chambers 21, 22, 23 is large, it is preferable that adjustments to and maintenance of the pressure in the center of the intermediate chamber 7 be made. In addition, in accordance with need, a cooling means can be provided in the intermediate chamber 7 to cool the substrate 9 following processing.

It will be noted that, in the above-described longitudinal movement mechanism configuration, it is preferable that the configuration of the inlet side of a guide rail 48 be such as to be able to easily receive the bottom edge of the support plates 923, 933 of the support holders 92, 93. That is to say, in the longitudinal movement mechanism, although the support holders 92, 93 are moved by transfer from the fore-front side guide rail 48 to the front guide rail 48, if the bottom edge of the support plates 923, 933 does not slide into the front guide rail 48 correctly at this time it leads to carry errors. In order to prevent this, taper should be provided in the side surfaces of the groove on the inlet side of the guide rail 48 to enlarge the opening on the inlet side, wherein the bottom edge of the support plates 923, 933 is more easily received.

Although three processing chambers 21, 22, 23 are longitudinally-provided in the present embodiment mode, the provision of four longitudinally-provided processing chambers is possible. In addition, where problems of atmosphere contamination arise in the three processing chambers 21, 22, 23 due to the dispersion of gas from, for example, the third processing chamber 23 into the second processing chamber 22, differential pumping is performed to maintain the pressure within the third processing chamber 23 lower by comparison with the pressure within the second processing chamber 22.

In addition, in the above-described preferred embodiment, although substrate holders of a configuration in which different left substrate holders 92 and right 93 substrate holders are used, substrate holders of completely identical configurations may be used. In this case, the substrate holders are alternately moved and returned along either the left-side return carry line 95L or the right-side return carry line 95R. At this time, the "alterations" may constitute one alteration of each, or two or more alterations may be used. It will be noted that, substrate holders of completely identical configuration refer to substrate holders of a configuration in which both the receiver plate 922 of the left substrate holder 92 shown in FIG. 2 and the receiver plate 932 of the right substrate holder 93 shown in FIG. 3 are fixed to the intermediate plate. The two receiver plates 922, 923, when viewed from the front surface, form an [∧]-shaped character.

It will be noted that, examples of the substrate 9 processed in the present invention include semiconductor wafers for semiconductor device manufacture, substrates for display devices such as liquid display or plasma display, substrates for information recording mediums such as hard disk, and substrates for printed wiring plates.

As is described above, based on the present invention because it is an interback-type device, that is to say, a configuration in which the substrate is inverted in the device and returned to the same side, carry-in and carry-out of the substrate to the device is performed on the same side of the device and assembly on existing manufactured lines is simple. In addition, because the return carry lines are different paths to the outward carry line, and at the least one thereof is branched in plurality, the number of processing steps can be increased without lengthening the length in the line direction, and productivity is increased.

In addition, when the outward carry line is parallel with the return carry lines, the layout of the chambers is reformed and unnecessary increase in the occupied area can be suppressed.

In addition, the point in which the branched return carry lines or outward carry line are parallel imparts an effect whereby the layout of the chambers is further reformed and unnecessary increase in the occupied area is suppressed.

In addition, if the outward carry line and return carry lines are set to pass through at least one common vacuum chamber, an effect is obtained in which the structure and operation is simplified.

In addition, if the processing within the same processing chambers is heat-processing or cooling-processing, the possibility of the generation of the problem of processing soiling is low.

In addition, if the substrate is carried and processed in a state in which it is held vertical or at an angle approaching vertical, a marked effect is obtained in suppression of increase of occupied area, the problem of warp of the substrate is resolved, and maintenance is made easier.

In addition, if the substrate holder holds two substrates simultaneously, productivity is doubled by comparison to the case where just one substrate is held.

In addition, if the substrate holder holds the substrate at an angle of 60° or above, even when two substrates are held, there is no enlarging of the occupied area in the horizontal direction compared to the holding of one substrate.

In addition, if the number of processing chambers is increased without lengthening of the length in the line direction, an effect is obtained in which the productivity can be increased.

In addition, if the substrate is carried in such a way that the plate surface thereof faces the side with respect to the carry line, the occupied area of the space in the horizontal direction required for carry can be reduced.

While the present invention has been described by reference to the above-mentioned embodiments, certain modifications and variations will be evident to those or ordinary skill in the art. Therefore, the present invention is limited only by the scope and spirit of the appended claims.

What is claimed is:

1. A substrate processing device in which a substrate is carried into the device from one side of the device and is inverted in the device to be carried out and returned to the same side, the device comprising:
   a plurality of vacuum processing chambers for administering a process on the substrate therein are longitudinally provided and hermetically connected to each other;
   a substrate carry system which passes through the vacuum chambers, the substrate carry system includes:

a unidirectional outward carry line that extends from a first position at a first side of the device to an inversion position within the device, a unidirectional return carry line from the inversion position to a second position at the first side of the device; and a second unidirectional return carry line from the inversion position to the first side of the device, wherein each of the carry lines has a different path and each of the carry lines passes through a plurality of the vacuum processing chambers.

2. The substrate processing device of claim 1, wherein the outward carry line and at least one of the return carry lines are parallel.

3. The substrate processing device of claim 1, wherein the outward carry line or at least one of the return carry lines are branched into a plurality of parallel lines.

4. The substrate processing device of claim 1, wherein the outward carry line and at least one of the return carry lines pass through at least one common vacuum chamber.

5. The substrate processing device of claim 4, wherein a processing device for heating or cooling the substrate on the outward carry line or at least one of the return carry lines is provided in the common vacuum chamber.

6. The substrate processing device of claim 1, wherein the carry line extends within a horizontal surface, the carry system comprises a substrate holder which holds the substrate upright in such a way that a plate surface thereof forms an angle of holding to the horizontal of between 45° and 90°, and the carry system further includes a horizontal movement mechanism that moves the substrate holder through the plurality of vacuum processing chambers to a perimeter vacuum chamber.

7. The substrate processing device of claim 6, wherein the substrate holder holds two substrates simultaneously.

8. The substrate processing device of claim 7, wherein the substrate holder holds the substrate upright in such a way that the plate surface thereof forms an angle of holding to the horizontal of between 60° and 90°.

9. The substrate processing device of claim 6, wherein the horizontal movement mechanism comprises a longitudinal movement mechanism which affords movement of the substrate holder in the longitudinal direction which constitutes the direction of the plurality of vacuum chambers, and a lateral movement mechanism which affords movement in the lateral direction which constitutes the horizontal direction perpendicular to the longitudinal direction.

10. The substrate processing device of claim 9, wherein the longitudinal movement mechanism carries the substrate in such a way that the plate surface of the substrate faces to the side with respect to the direction of carry.

11. A substrate processing device in which a substrate is carried into the device from one side of the device and is inverted in the device to be carried out and returned to the same side, the device comprising:

a load lock chamber for loading and unloading the substrate at the same side of the device;

a plurality of vacuum processing chambers for administering a process on the substrate therein are longitudinally provided and hermetically connected to each other;

an intermediate chamber arranged between the load lock chamber and the plurality of vacuum processing chambers;

a substrate carry system which passes through the intermediate chamber and the plurality of vacuum chambers, the substrate carry system includes:

a unidirectional outward carry line that extends from a first position at a first side of the device to an inversion position within the device, a unidirectional return carry line from the inversion position to a second position at the first side of the device;

an intermediate line extending from the intermediate chamber to the load lock chamber;

a branch line in the intermediate chamber along which the substrate can be moved from the intermediate line to the outward carry line or from the return carry line to the intermediate line; and a second unidirectional return carry line from the inversion position to the first side of the device, wherein each of the carry lines has a different path and each of the carry lines passes through a plurality of the vacuum processing chambers.

12. The substrate processing device of claim 11, wherein the outward carry line and at least one of the return carry lines are parallel.

13. The substrate processing device of claim 11, wherein the outward carry line and at least one of the return carry lines pass through at least one common vacuum chamber.

14. The substrate processing device of claim 13, wherein a processing device for heating or cooling the substrate on the outward carry line or at least one of the return carry lines is provided in the common vacuum chamber.

15. The processing device of claim 1, further comprising:

an inversion chamber arranged at an end of the device opposite the load lock chamber;

an inversion line in the inversion chamber along which the substrate can be moved from the inversion line to or from the outward carry line and at least one of the return carry lines.

16. A substrate processing device in which a substrate is carried into the device from one side of the device and is inverted in the device to be carried out and returned to the same side, the device comprising:

a plurality of vacuum processing chambers for administering a process on the substrate therein are longitudinally provided and hermetically connected to each other;

a substrate carry system which passes through the vacuum chambers, the substrate carry system includes:

a unidirectional outward carry line that extends from a first position at a first side of the device to an inversion position at the end of the unidirectional outward carry line within the device, a unidirectional return carry line from the inversion position to a second position at the first side of the device; and a second unidirectional return carry line from the inversion position to the first side of the device, wherein each of the carry lines has a different path and each of the return carry lines passes through a plurality of the vacuum processing chambers.

17. A substrate processing device in which a substrate is carried into the device from one side of the device and is inverted in the device to be carried out and returned to the same side, the device comprising:

a load lock chamber for loading and unloading the substrate at the same side of the device;

plurality of vacuum processing chambers for administering a process on the substrate therein are longitudinally provided and hermetically connected to each other;

an intermediate chamber arranged between the load lock chamber and the plurality of vacuum processing chambers;

a substrate carry system which passes through the intermediate chamber and the plurality of vacuum chambers, the substrate carry system includes:
a unidirectional outward carry line that extends from a first position at a first side of the device to an inversion position at the end of the unidirectional outward carry line within the device,
a unidirectional return carry line from the inversion position to a second position at the first side of the device;
an intermediate line extending from the intermediate chamber to the load lock chamber;
a branch line in the intermediate chamber along which the substrate can be moved from the intermediate line to the outward carry line or from the return carry line to the intermediate line; and
a second unidirectional return carry line from the inversion position to the first side of the device, wherein each of the carry lines has a different path and each of the return carry lines passes through a plurality of the vacuum processing chambers.

* * * * *